United States Patent
Goo et al.

(10) Patent No.: US 7,585,786 B2
(45) Date of Patent: Sep. 8, 2009

(54) METHODS OF FORMING SPIN-ON-GLASS INSULATING LAYERS IN SEMICONDUCTOR DEVICES AND ASSOCIATED SEMICONDUCTOR DEVICE

(75) Inventors: Juseon Goo, Gyeonggi-do (KR); Eunkee Hong, Gyeonggi-do (KR); Hong-Gun Kim, Gyeonggi-do (KR); Kyu-Tae Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 559 days.

(21) Appl. No.: 11/010,223

(22) Filed: Dec. 10, 2004

(65) Prior Publication Data

US 2005/0130439 A1 Jun. 16, 2005

(30) Foreign Application Priority Data

Dec. 10, 2003 (KR) .................... 10-2003-0089305

(51) Int. Cl.
*H01L 21/31* (2006.01)
(52) U.S. Cl. .................. 438/785; 438/763; 438/275; 438/782; 438/595
(58) Field of Classification Search ................ 438/654, 438/660, 680, 683, 685, 687, 688, 761, 778, 438/781, 785, 787, FOR. 395, FOR. 396, 438/FOR. 405, 763, 275, 782; 257/634, 257/644, 650
See application file for complete search history.

(56) References Cited

U.S. PATENT DOCUMENTS

| 6,197,631 B1 * | 3/2001 | Ishihara ...................... 438/240 |
|---|---|---|
| 6,727,184 B1 * | 4/2004 | Wang et al. .................. 438/712 |
| 6,861,334 B2 * | 3/2005 | Raaijmakers et al. ....... 438/435 |
| 6,979,903 B1 * | 12/2005 | Avanzino et al. ............ 257/751 |
| 2002/0058411 A1 * | 5/2002 | Hasegawa et al. ........... 438/653 |
| 2004/0082194 A1 * | 4/2004 | Wang et al. .................. 438/782 |

FOREIGN PATENT DOCUMENTS

| JP | 63-111648 | 5/1988 |
|---|---|---|
| KR | 1997-0053518 | 7/1997 |
| KR | 2002-0041582 | 6/2002 |
| KR | 2003-0034328 | 5/2003 |

OTHER PUBLICATIONS

Notice to Submit a Response for Korean patent application No. 10-2003-0089305 mailed on Jul. 22, 2005.
Machine Translation of 10-2002-0041582; published Jun. 3, 2002 (http://kposd.kipo.go.kr:8088/up/subin.jsp?langtype = E&AN = 1020000071240&PK = A.

* cited by examiner

*Primary Examiner*—N Drew Richards
*Assistant Examiner*—Mamadou Diallo
(74) *Attorney, Agent, or Firm*—Myers Bigel Sibley & Sajovec

(57) ABSTRACT

Methods of forming an insulating layer in a semiconductor device are provided in which a metal oxide layer is formed on a semiconductor structure that includes a plurality of gap regions thereon. A spin-on-glass layer is formed on the metal oxide layer, and then the semiconductor structure is heated to a temperature of at least about 400° C. The spin-on-glass layer may comprise a siloxane-based material, a silanol-based material or a silazane-based material.

18 Claims, 8 Drawing Sheets

METHODS OF FORMING SPIN-ON-GLASS INSULATING LAYERS IN SEMICONDUCTOR DEVICES AND ASSOCIATED SEMICONDUCTOR DEVICE

CROSS-REFERENCE OF RELATED APPLICATIONS

This application claims priority under 35 U.S.C. § 119 from Korean Patent Application No. 2003-89305, filed on Dec. 10, 2003, the disclosure of which is incorporated herein by reference as if set forth in its entirety.

FIELD OF THE INVENTION

The present invention relates to methods of manufacturing semiconductor devices and, more particularly, to methods of forming semiconductor device insulating layers and to the semiconductor devices formed by such methods.

BACKGROUND OF THE INVENTION

As semiconductor devices become more highly integrated, very fine patterns may be formed on the semiconductor substrate. As part of the fabrication process, gaps or holes are often formed in these very fine patterns such as, for example, the contact holes that may be formed during the manufacture of various semiconductor memory devices. As the size of the pattern is reduced, the aspect ratio of the gaps in the pattern (the ratio of the gap height to the gap length) typically is increased. As this aspect ratio increases, it may become more difficult to satisfactorily fill the gap in subsequent steps of the manufacturing process.

In many cases, various of the gaps or holes in the pattern are filled with an insulating material such as an interlayer insulator. Various techniques have been used in an effort to fill gaps in fine semiconductor patterns with insulating interlayer materials. For example, in one known technique, a boron phosphor silicate glass (BPSG) is deposited (as the insulating material) on a substrate on which the fine pattern has already been formed, and a reflow process is performed on the BPSG layer at a temperature of 830° C. or more. During the reflow process, the BPSG may flow into and fill the gaps in the pattern. However, the high temperature applied to the device during the reflow process may cause thermal damage to the substrate.

As another example, it is known that a tetraethylorthosilicate (TEOS) or an undoped silicate glass (USG) may be deposited as an insulating interlayer on a semiconductor substrate to fill the gaps in a fine pattern. The TEOS or the USG may be deposited, for example, using a high-density plasma enhanced chemical vapor deposition (HDP-CVD) process. However, the TEOS or the USG may have a strong tendency to form a void or seam during the deposition process, and thus may not fully fill the gaps in the fine pattern.

As yet another example, a spin-on-glass (SOG) composition has been suggested as an insulating interlayer material as disclosed in Korean Publication Patent No. 2003-34328. In particular, polysilazane may be dissolved into an organic solvent, and the polysilazane solution may then be supplied onto the surface of a spinning wafer to form the SOG layer on the wafer. The solvent component may thereafter be removed from the SOG layer using, for example, a soft baking process. A hard baking process may then be performed on the SOG layer in an oxidizing atmosphere to form the silicon oxide layer on the wafer. Since the SOG is coated on the substrate in a liquid state, the gap fill characteristic of the material and the aspect ratio of the pattern may be improved.

The hard baking process which is carried out during the formation of the SOG layer may facilitate removal of elements such as, for example, hydrogen which may be present in the SOG layer that is initially deposited on the substrate. However, when the SOG layer is formed on a pattern that has very fine gaps, it may be difficult to supply adequate oxygen adjacent the bottom surfaces of the gaps in the pattern during the hard baking process. If sufficient oxygen is not supplied in this region during the hard baking process, the hard baking process may fail to remove extraneous elements, such as hydrogen, from the SOG layer. If sufficient of these elements remain, they may cause one or more voids to form in the silicon oxide layer (i.e., the silicon oxide layer may be porous). When a porous silicon oxide layer that includes a plurality of voids is etched and/or cleaned during subsequent processing steps, portions of the silicon oxide layer adjacent to the voids may etch away at a faster rate than do other non-porous portions of the silicon oxide layer.

For example, during the manufacture of a semiconductor memory device, a plurality of bit lines may be formed on a semiconductor substrate. When a silicon oxide layer is formed between the bit lines using the conventional SOG deposition process described above, the silicon oxide layer formed by the SOG process may be porous in the vicinity of the bottom portion of the gap between the bit lines. When the silicon oxide layer is etched away during subsequent processing step(s) in order to form a contact hole between the bit lines, one or more voids in the porous silicon oxide layer may appear along the lower inner surface of the contact hole. When a cleaning solution is thereafter supplied to the substrate for cleaning the by-products of the etching process, the portion of the contact hole around the exposed void may tend to be quickly etched away due to an etching component in the cleaning solution as compared with other portions of the contact hole.

FIG. 1 is a cross-sectional view illustrating a contact hole which may result when the above-described conventional process is used to form the contact holes. As shown in FIG. 1, a silicon oxide layer 11 is provided on a semiconductor substrate. The silicon oxide layer 11 includes porous portions 10. As shown in FIG. 1, these porous portions 10 of the silicon oxide layer 11 may etch away more quickly during, for example, a cleaning process that is part of the process for forming the contact hole as compared with other portions of the silicon oxide layer 11. As a result, the surface profile of the porous portions 10 of the silicon oxide layer 11 may be very rough (which is sometimes referred to as a "bad" profile), while the surface profile of the remaining portions of the contact hole 12 may be relatively smooth (which is sometimes referred to as a "good" profile). As shown in FIG. 1, the portion of the contact hole having a "bad" profile may tend to be concentrated at the lower portions of the contact hole 12. This indicates that it is the lower portion of the silicon oxide layer 11 that primarily includes the porous areas.

The above described over-etching of the porous portions of the silicon oxide layer may cause a "penetration hole" to form between adjacent contact holes. During a subsequent step in the manufacturing process, a conductive layer is formed in the contact holes. If a penetration hole exists in the silicon oxide layer that separates adjacent contact holes, the penetration hole may fill with the conductive material. If this occurs, the conductive layer acts to electrically connect the two contact holes, thereby generating a bridge failure in the semiconductor memory device.

SUMMARY OF THE INVENTION

Pursuant to embodiments of the present invention, methods of forming an insulating layer in a semiconductor device are provided in which a metal oxide layer is formed on a semiconductor structure that includes a plurality of gap regions thereon. A spin-on-glass layer is formed on the metal oxide layer, and then the semiconductor structure is heated to a temperature of at least about 400° C.

In these methods, sufficient heat treatment may be provided to the semiconductor structure to convert the spin-on-glass layer into a silicon oxide layer. The metal oxide layer may be formed using an atomic layer deposition process. The metal oxide layer may be formed by forming a metal layer on the semiconductor structure and thereafter oxidizing the metal layer. In specific embodiments of the present invention, the metal oxide layer may have a thickness of less than about 15 Å. In certain embodiments of the present invention, the spin-on-glass layer is formed directly on the metal oxide layer. Moreover, the metal oxide layer may act as a catalyst to increase the density of silicon-oxide bonds in at least portions of the spin-on-glass layer.

Pursuant to further embodiments of the present invention, methods of forming an insulating layer of a semiconductor device are provided in which one or more layers are formed on a substrate to provide a semiconductor structure that includes a plurality of gap regions. A catalytic layer for catalyzing a combination of silicon and oxygen is then formed on the semiconductor structure. A spin-on-glass (SOG) layer is formed on the catalytic layer, and then a silicon oxide layer is formed by heating the SOG layer.

In these methods, the catalytic layer may be formed, for example, using an atomic layer deposition (ALD) process. The catalytic layer may include a first atomic layer through a fifth atomic layer and/or may have a thickness of no more than about 10 Å. In certain embodiments of the present invention, the catalytic layer may comprise a metal layer or a metal oxide layer. In embodiments where the catalytic layer is a metal oxide layer, the metal oxide layer may be formed by depositing a metal layer and then oxidizing the metal layer during the heating of the SOG layer.

In certain embodiments of the present invention, the SOG layer may comprise at least one of a siloxane-based material, a silanol-based material and/or a silazane-based material. The SOG layer may be heated for at least about 10 minutes at a temperature of about 400° C. or more in an oxidizing atmosphere (such as, for example, oxygen and/or water) or in an inert gas atmosphere.

Pursuant to still further embodiments of the present invention, methods of forming an insulating layer of a semiconductor device are provided in which a catalytic layer is formed on a surface of a stepped structure on a substrate for catalyzing a combination of silicon and oxygen. A first layer that includes a siloxane-based material is then formed on the catalytic layer, and a silicon oxide layer is formed by performing a heat treatment process on the first layer.

In still further embodiments of the present invention, methods of forming an insulating layer of a semiconductor device are provided in which an adhesion layer comprising a metal or a metal oxide is formed along a surface of a stepped structure on a substrate. A spin-on-glass (SOG) layer is formed on the adhesion layer, and a silicon oxide layer is then formed by performing a heat treatment process on the SOG layer.

Pursuant to further aspects of the present invention, semiconductor devices are provided which include a substrate, one or more material layers which include a plurality of openings on the substrate, a metal oxide layer that is on respective bottom surfaces of the plurality of openings and within the openings, and a first layer that is directly on the metal oxide layer, where the first layer comprises a material containing silicon. In certain embodiments of the present invention, the semiconductor device can be an intermediate structure and the first layer may comprise a spin-on-glass (SOG) layer. In other embodiments, the first layer may comprise a silicon oxide layer. The metal oxide layer may have a thickness of less than about 15 Å.

Pursuant to still further embodiments of the present invention, semiconductor devices are provided which comprise a structure including at least one semiconductor layer on a substrate, the structure including a top surface with a plurality of openings therein. In these devices, a catalytic layer is provided on the top surface of the semiconductor structure and within the plurality of openings. A silicon oxide layer is directly on the catalytic layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 5A and 5B are SEM photographs of insulating interlayers made according to further embodiments of the present invention; and.

DESCRIPTION OF THE EMBODIMENTS

Figure 1:
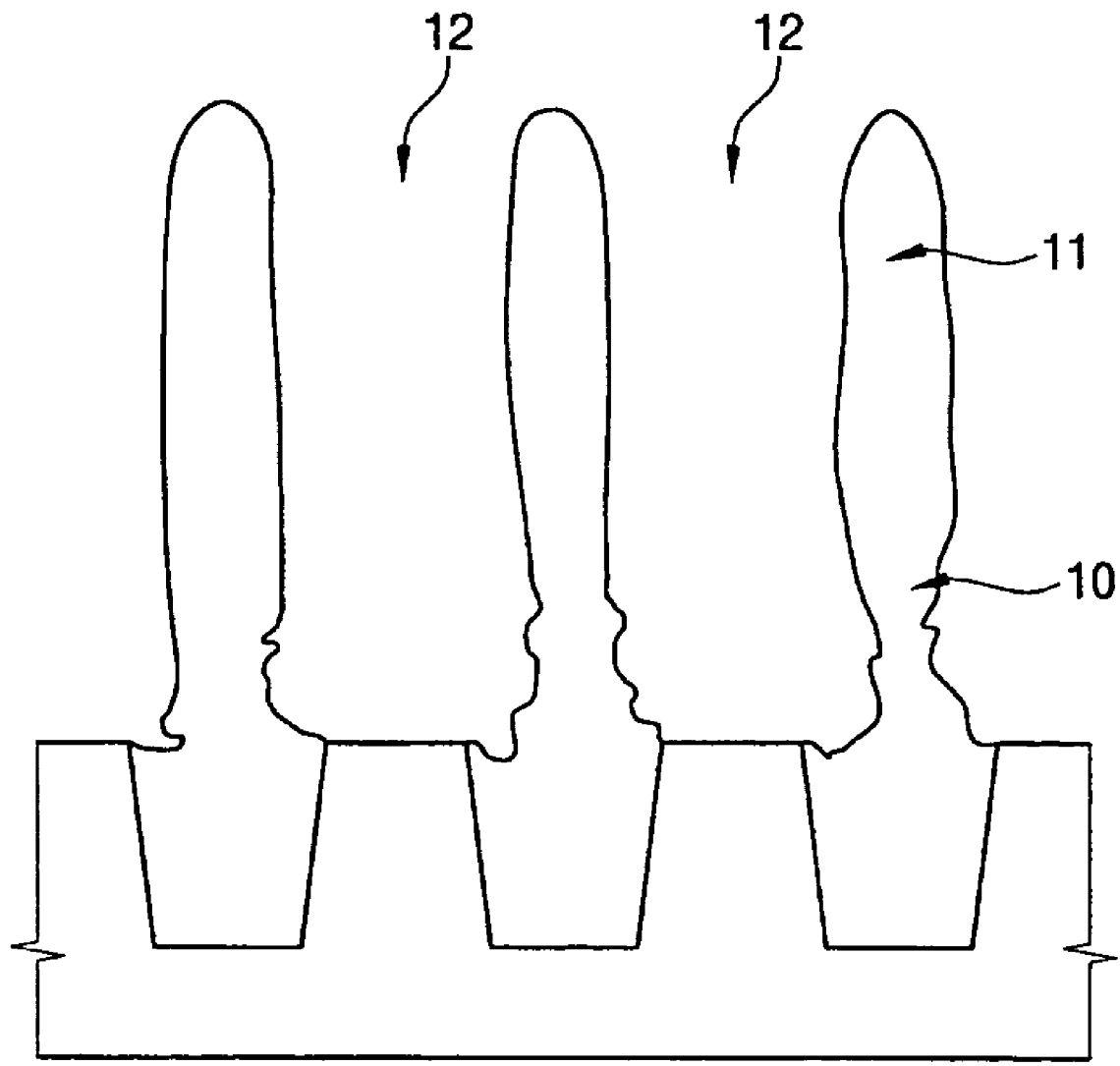
FIG. 1 is a cross-sectional view illustrating a contact hole formed on a conventional porous silicon oxide layer.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-sectional illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the exact shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Pursuant to embodiments of the present invention, semiconductor devices are provided that include a catalytic layer that is formed along a surface of a stepped structure on a semiconductor substrate. The term "catalytic layer" is used to refer to a layer that facilitates and/or expedites a chemical reaction in a subsequently formed layer or region of the semiconductor device. In certain embodiments of the present invention, the stepped structure may include one or more stepped portions that correspond to and/or result from a trench isolation structure, a word line structure and/or a bit line structure. Thus, it will be appreciated that the methods of the present invention may be used, for example, to form an insulating interlayer in an isolation trench, a word line or a bit line.

Pursuant to embodiments of the present invention, the catalytic layer may include catalysts that expedite a reaction whereby chemical bonds between silicon and oxygen (hereinafter referred to as Si—O bonds) are substituted for other chemical bonds (hereinafter referred to as non Si—O bonds) in an SOG layer that is included in the semiconductor device. This substitution process may occur because oxygen in the catalyst layer reacts with silicon to facilitate substitution of non Si—O bonds in the structure with Si—O bonds. This may, among other things, improve the adhesion characteristic of the SOG material.

In certain embodiments of the present invention, the catalytic layer may comprise a metal layer and/or a metal oxide layer. When the catalytic layer comprises a metal layer, the metal may be coated such that it is sufficiently thin such that the metal layer is oxidized into a metal oxide layer during a subsequent heat treatment process such as a thermal treatment applied to the SOG layer. In addition, the metal layer may be formed such that the surface thereof is rapidly oxidized when exposed to air. If the metal layer is not sufficiently oxidized, a bottom surface of the insulating interlayer may act as a conductive layer, such that contacts formed via a subsequent contact hole process may become electrically connected to each other.

Examples of the metals that may be used to form the catalytic layer include aluminum (Al), barium (Ba), strontium (Sr), titanium (Ti), bismuth (Bi), niobium (Nb), tantalum (Ta), gallium (Ga), indium (In), scandium (Sc), vanadium (V), chromium (Cr), manganese (Mn), cobalt (Co), iron (Fe), nickel (Ni), copper (Cu), zinc (Zn), lanthanum (La), etc. and/or combinations of the above metals. Examples of the metal oxides that may be used to form the catalytic layer include aluminum oxide, barium oxide, strontium oxide, titanium oxide, bismuth oxide, niobium oxide, tantalum oxide, gallium oxide, indium oxide, scandium oxide, vanadium oxide, chromium oxide, manganese oxide, cobalt oxide, iron oxide, nickel oxide, copper oxide, zinc oxide, lanthanum oxide, etc. and/or combinations of the above.

As discussed above, the catalytic layer may be used to expedite the chemical reaction between the silicon and oxygen at the bottom surface of the insulating interlayer. In certain embodiments of the present invention, the catalytic layer may be relatively thin. In these (and other) embodiments of the present invention, the catalyst that forms the catalytic layer may have a high dielectric constant as compared with the dielectric constant of the silicon oxide that forms the insulating interlayer. If the catalytic layer is too thick, it may result in a potentially undesirable increase of a parasitic capacitance.

In particular, when a gap between conductive structures such as word line structures or bit line structures is filled with an insulating interlayer, if the catalytic layer has a high dielectric constant and is relatively thick, it may increase the parasitic capacitance since the gap between the conductive structures is very small. Such an increase in the parasitic capacitance may decrease the operating speeds of the semiconductor device. Therefore, in certain embodiments of the present invention, the catalytic layer may be formed to have a thickness of about 10 Å or less. This may facilitate minimizing the parasitic capacitance in certain embodiments of the present invention.

In certain embodiments of the present invention, the catalytic layer may be formed using an atomic layer deposition (ALD) process. The ALD process may be used, by way of example, to form a thin catalytic layer such that a first atomic layer through a fifth atomic layer may be stacked on the surface of the stepped structure.

After the catalytic layer is formed, a spin-on-glass (SOG) layer may be formed on the catalytic layer. Thereafter, a heat treatment may be applied to form a silicon oxide layer on the surface of the stepped structure. In certain embodiments of the present invention, the heat treatment may be performed for about 10-120 minutes at a temperature of about 400° C. or more.

In the above-described embodiments of the present invention, the SOG layer may comprise, for example, a siloxane-based material, silanol-based material, a silazane-based material, etc. The siloxane-based material may include, for example, a structural unit of —(HSiO$_{0.5}$)$_n$—. The silanol-based material may include, for example, a structural unit of —(SiOH)$_n$—. The silazane-based material may include, for example, a structural unit of —(SiH$_2$NH$_2$)$_n$—. In the above structures, n denotes positive integers.

The siloxane-based materials include an Si—O bond therein. As such, separation of the hydrogen (H) from the siloxane-based material forms the silicon oxide layer. The silanol-based materials include an Si—OH bond and an Si—H bond as well as the Si—O bond therein. Accordingly, with silanol-based materials, a substitution of the hydroxyl group (—OH) with oxygen (O) or a removal of hydrogen (H) from the hydroxyl group are the mechanisms that form the silicon oxide layer.

The silazane-based materials, such as polysilazane, include non Si—O bonds such as an Si—H bond, an Si—N bond and an N—H bond therein. As such, in these materials oxygen may first be provided to the silazane-based material, and then a substitution of the non Si—O bonds with Si—O bonds may be performed to form the silicon oxide layer.

When the SOG layer comprises a silazane-based material such as, for example, polysilazane, the heat treatment may be performed in an oxidizing atmosphere to facilitate substitution of the structural unit of the Si—H bond, the Si—N bond and the N—H bond with the Si—O bond in the silazane-based material, thereby forming the silicon oxide layer. The oxidizing atmosphere may comprise, for example, oxygen, water or a mixture of the oxygen and water.

When the SOG layer comprises a silanol-based material or a siloxane-based material, the heat treatment may be performed in any one of a variety of different atmospheres as the structural unit of the silanol-based material or the siloxane-based material includes the Si—O bond. By way of example, the heat treatment may be performed in an inert gaseous atmosphere or in a vacuum atmosphere as well as in the oxidizing atmosphere. Examples of inert gas atmospheres include Nitrogen (N), Argon (Ar), Helium (He) and Hydrogen (H) atmospheres. One or more heat treatments may be applied, and the temperature may be varied during and/or between heat treatments.

According to certain embodiments of the present invention, the number of Si—O bonds in the insulating interlayer may be increased so that the insulating interlayer becomes denser and/or the etching resistance thereof is increased. In particular, when the SOG layer comprises a siloxane-based material, the hydrogen (H) in the siloxane-based material reacts with the oxygen (O) in the catalytic layer; thus the hydrogen (H) may be easily dissociated from the siloxane-based material. In addition, the silicon (Si) in the siloxane-based material may react with the oxygen (O) in the catalytic layer, thereby increasing the number of Si—O bonds on the surface of the stepped structure and/or condensing the SOG layer. Accordingly, the etching resistance of a silicon oxide layer formed from an SOG layer that comprises a siloxane-based material may be higher than the etching resistance of a silicon oxide layer formed from an SOG layer that comprises a siloxane-based or a silanol-based material.

FIGS. 2A through 2E are cross sectional views illustrating methods of forming a semiconductor device that includes an insulating interlayer according to certain embodiments of the present invention.

Figure 2A:
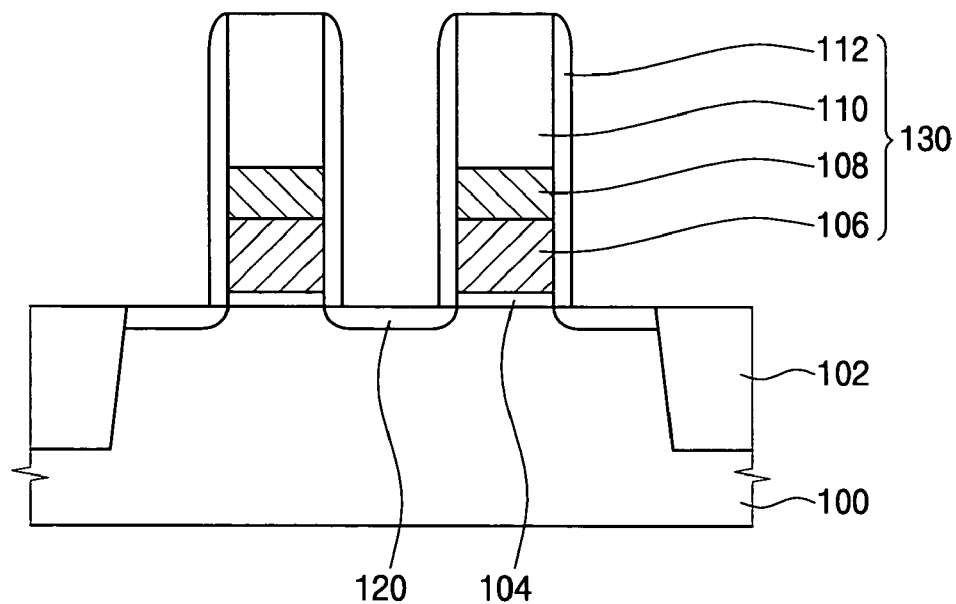
FIGS. 2A to 2E are cross-sectional views illustrating a method of forming an insulating layer according to certain embodiments of the present invention.

Referring to FIG. 2A, a conventional shallow trench isolation (conventional STI) process may be performed on a semiconductor substrate 100 to define an active region and a field region 102 on the substrate 100. For example, the trench in the field region 102 may be partially or completely filled with an oxide layer.

Still referring to FIG. 2A, a gate oxide layer 104 may be formed on the substrate 100 including the active region and the field region 102 to a thickness of, for example, about 300 Å. A polysilicon layer doped with impurities may then be formed on the gate oxide layer 104 to a thickness of, for example, about 500 Å to about 4000 Å. Then, a tungsten or tungsten silicide layer may be formed on the polysilicon layer to a thickness of, for example, about 1000 Å to about 2000 Å using, for example, a sputtering method or a chemical vaporization deposition (CVD) method. The tungsten (or tungsten silicide) layer may facilitate reducing the electrical resistance of the gate oxide layer.

A silicon nitride layer may then be formed on the tungsten layer as a hard mask layer. The silicon nitride layer may be formed, for example, to a thickness of about 500 Å to about 2000 Å. In certain embodiments of the present invention, the silicon nitride layer may be formed using a low pressure CVD method or a plasma enhanced CVD method.

A photoresist film may then be formed on the silicon nitride layer. Thereafter, the photoresist film may be selectively exposed and developed to form a photoresist pattern for a gate electrode. The silicon nitride layer, the tungsten layer and the polysilicon layer may then be sequentially etched away using the photoresist film as an etching mask to form a gate electrode that includes a polysilicon pattern 106, a tungsten pattern 108 and a silicon nitride pattern 110. Additionally, impurities may be implanted into a surface portion of the substrate 100 to form source/drain regions 120 in the substrate 100.

A silicon nitride layer may then be formed on the substrate 100 to a thickness, for example, of about 200 Å to 600 Å. The silicon nitride layer may then be anisotropically etched to form a spacer 112 on the sidewalls of the gate electrode. Hereinafter, the gate electrode and the nitride spacer 112 are referred to as a gate structure 130. An ion implantation process may further be performed to increase the doping density of the source/drain regions 120.

As discussed above, as the integration of semiconductor devices such as semiconductor memory devices increases, the gap between the gate structures 130 may become very small. By way of example, current highly integrated semiconductor devices may have gaps between the gate structures that range from between about 0.2 μm to about 1 μm in length, and the aspect ratio of these gaps (i.e., the ratio of the height of the gate structure 130 to the gap length) may be about 5:1 to about 20:1. It will be appreciated, however, that the methods of embodiments of the present invention may be employed on semiconductor devices having integration densities either higher or lower than the exemplary integration densities discussed above.

Figure 2B:
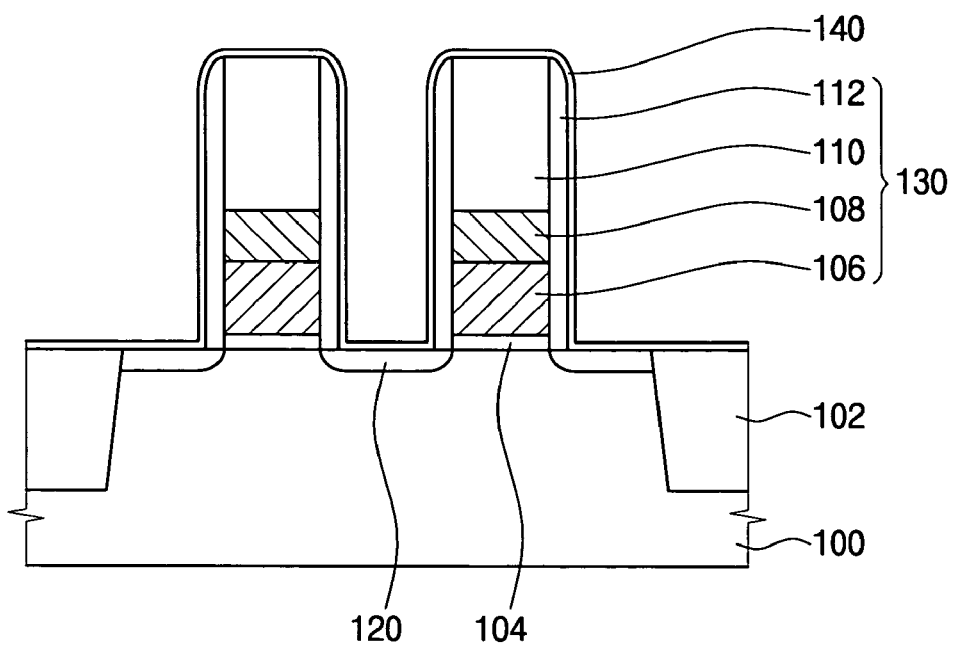

As shown in FIG. 2B, in a specific embodiment of the present invention, an aluminum oxide layer 140 may be formed on the surface of the gate structure 130. This aluminum oxide layer may act as a catalyst for expediting a combination such as a chemical bonding. The aluminum oxide layer 140 may also function as an adhesion layer to improve the adhesion of a subsequently deposited SOG layer to the semiconductor substrate.

As will be understood by those of skill in the art, the aluminum oxide layer 140 may have a relatively high dielectric constant as compared to the dielectric constant of a conventional silicon oxide insulating interlayer. As such, parasitic capacitances between the gate structures 130 may increase due to the addition of the aluminum oxide layer 140. According to certain embodiments of the present invention, this potential increase in parasitic capacitance may be reduced or minimized by forming a relatively thin aluminum oxide layer 140, such as, for example, an aluminum oxide layer having a thickness of about 10 Å or less. It will be appreciated, however, that aluminum oxide layers (or other metal oxide layers) having an increased thickness may also be used in other embodiments of the present invention.

In certain embodiments of the present invention, an atomic layer deposition (ALD) method may be used to deposit the aluminum oxide layer 140. ALD deposition processes can be used to deposit relatively thin layers such as layers having a thickness of less than 10 Å. Such an ALD process may be carried out, for example, using trimethyl aluminum (TMA, $Al(CH_3)_3$) as a metal precursor and using an ozone gas as an oxidizing agent at a temperature of about 350 to about 500 degrees Celsius to form the aluminum oxide layer 140. Assuming that a general ALD process completes a cycle thereof by circulating the steps of introducing a metal precursor, a first purging, an oxidizing agent and a second purging, the ALD process for forming the aluminum oxide layer 140 may be repeated for 10 (or less) cycles, so that the aluminum oxide layer 140 is formed to have a first atomic layer through a fifth atomic layer.

When the aluminum oxide layer 140 is formed using the ALD process, a plurality of bonding sites may be provided in the aluminum oxide layer 140 that may react strongly with a material provided in a subsequent step of the manufacturing process. As a result, the chemical bond characteristics between the aluminum oxide layer and the subsequently deposited layer may be remarkably improved. Specifically, the oxygen (O) in the aluminum oxide layer 140 may function as the bonding site, and may react strongly with the material of an insulating interlayer formed in a subsequent process. As a result of this reaction, the strength of the chemical bond between the aluminum oxide layer and the insulating interlayer may be significantly enhanced. Accordingly, the insulating interlayer may form strong chemical bonds with the the aluminum oxide layer 140 even at the bottom portion of the stepped portion (i.e., adjacent the bottom portions of the gate structures 130).

Although the specific embodiment of the present invention described above uses aluminum oxide as the catalyst for expediting the chemical reaction, it will be appreciated by those of skill in the art in light of the present disclosure that a wide variety of metal oxides, or metals that easily oxidize into metal oxides, could alternatively be used as the catalyst.

Figure 2C:
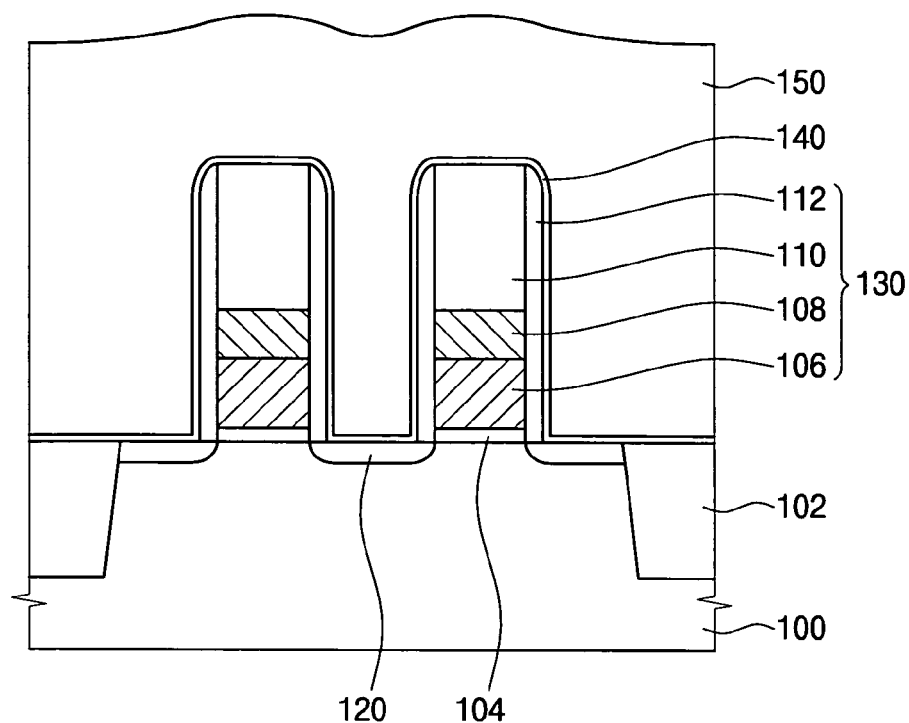

As shown in FIG. 2C, an SOG composition that includes, for example, a siloxane-based material, may next be coated on the surface of the stepped structure 130 using a spin coating method. This SOG composition is deposited to form an SOG layer 150. As will be appreciated by those of skill in the art in light of the present disclosure, the gap fill characteristic (i.e., the degree to which the SOG material evenly and completely fills the gap) of the SOG layer may be superior to the gap fill characteristic of a conventional layer that is, for example, deposited using a chemical vapor deposition process. The SOG layer 150 may be coated to a thickness sufficient to fill the gaps between the gate structures 130.

Figure 2D:
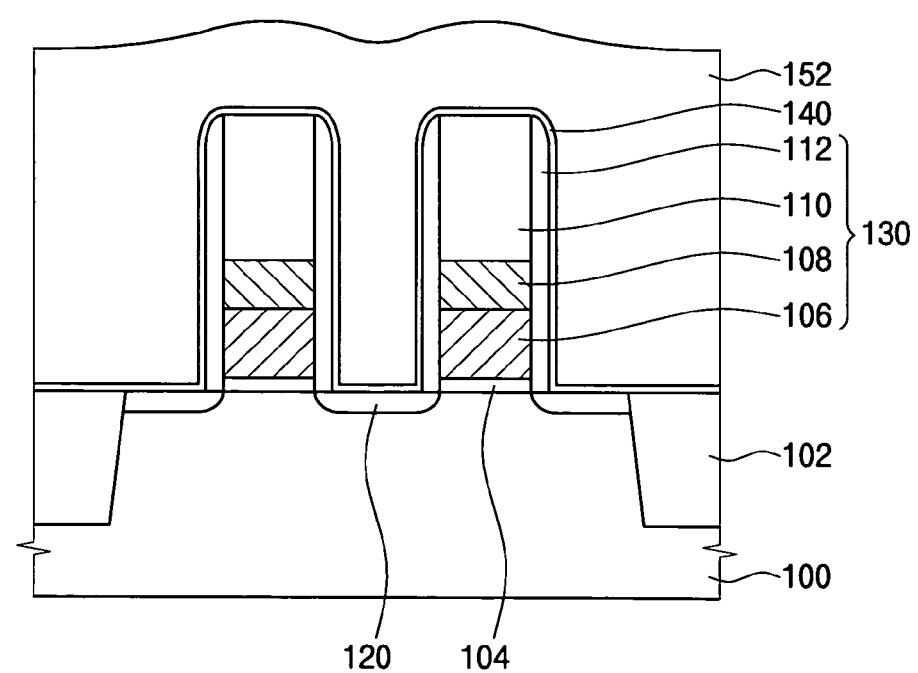

Referring to FIG. 2D, next a heat treatment process is performed on the SOG layer 150 to convert the SOG layer 150 into a silicon oxide layer 152. This heat treatment may be performed, for example, at a temperature of about 400° C. or more. The heat treatment process may include one or more heating steps, and the temperature may be varied during the heating steps or held constant. As an example, the heating step may comprise a preliminary heat treatment process that is performed for about 1-5 minutes at one or more temperatures in the range from 100° C. to 500° C., and a final heat treatment process that is performed for about 10-180 minutes at a temperature of about 600° C. to about 900° C.

During this heat treatment process, hydrogen (H) in the siloxane-based material may be removed due to a weak bonding energy and/or due to a chemical reaction with oxygen (O) in the catalytic layer. As a result, the SOG layer 150 is transformed into a silicon oxide layer 152. The SOG layer may also shrink and increase in density due to the heat treatment.

As discussed above, in certain conventional methods of forming an insulating layer, most of the SOG layer that is coated on the upper portion of the stepped structure is transformed into a relatively dense silicon oxide layer. However, portions of the SOG layer that are coated on or near the bottom of the stepped structure may not be transformed into silicon oxide since the heat may not be as effectively conducted to the bottom portion of the stepped structure and/or because insufficient oxygen (O) may be present in this area.

However, according to embodiments of the present invention, an aluminum oxide layer or other metal oxide layer that functions as a catalytic layer that accelerates or expedites the chemical reaction may be coated on the bottom portion of the stepped structure. This catalytic layer may make it easier to form a good silicon oxide layer from, for example, a siloxane-based material.

Figure 3:
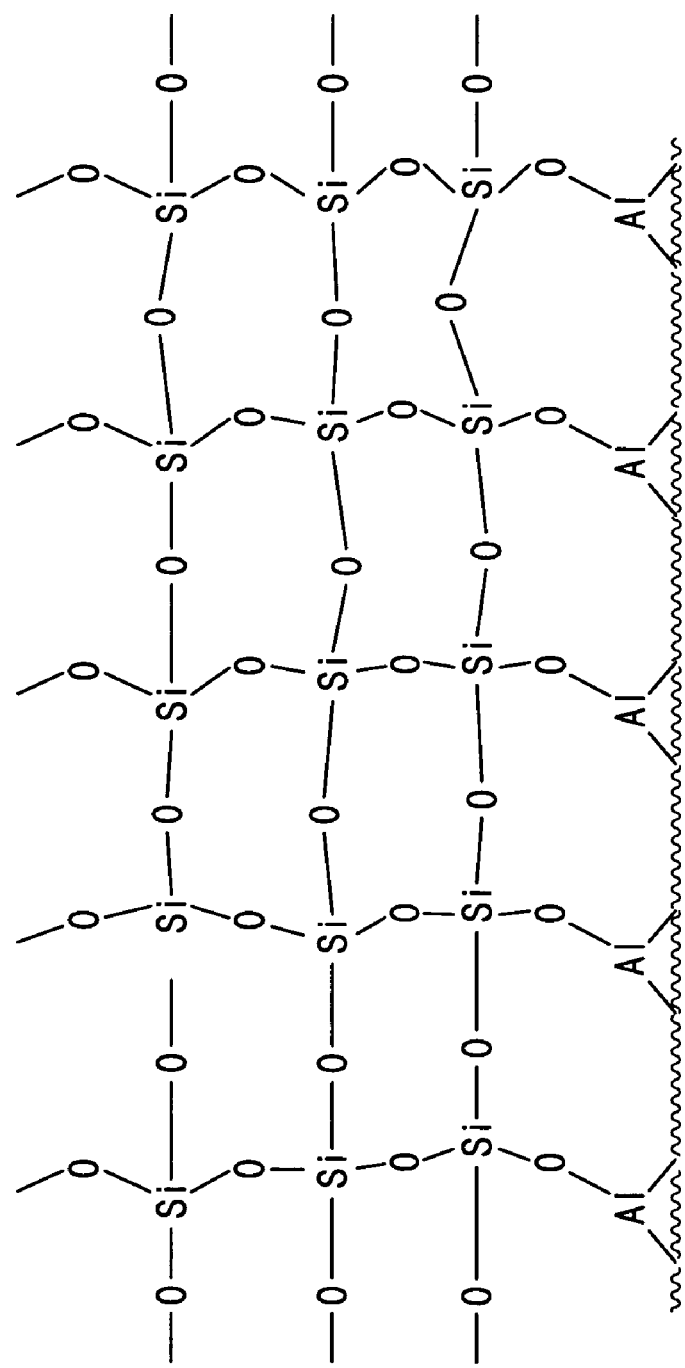
FIG. 3 illustrates an expected bonding structure of an insulating interlayer formed according to the methods described with respect to FIGS. 2A-2E.

FIG. 3 depicts the expected bonding structure of the insulating interlayer according to certain embodiments of the present invention. It will be appreciated that FIG. 3 is an idealized figure and that the actual bonding structure may differ from the exact structure depicted in FIG. 3.

As shown in FIG. 3, the aluminum oxide layer (which may act as a catalytic layer) is coated on the substrate. The hydrogen (H) may be rapidly removed from the siloxane-based material by chemical reaction with oxygen (O) in the aluminum oxide layer. The oxygen (O) in the catalytic layer may also strongly bond to the silicon (Si) in the siloxane-based material. As shown in FIG. 3, the Si—O bonds may continuously progress to the upper portion of the stepped structure, thereby forming a bridge bond from the bottom portion to the upper portion of the stepped structure. As a result, the strength of the bonding structure of the insulating interlayer may be enhanced from the bottom portion to the upper portion of the stepped structure.

Figure 2E:
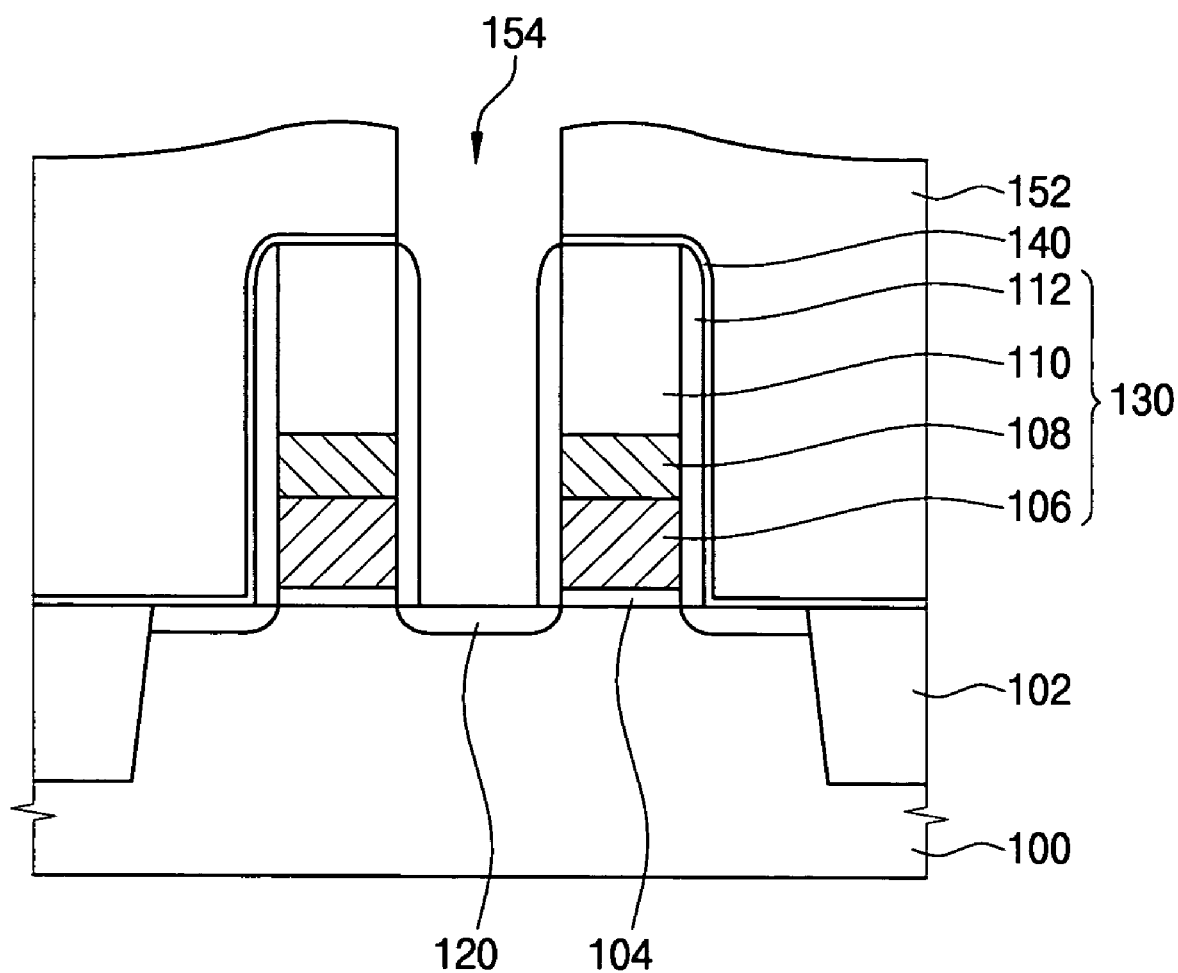

Referring to FIG. 2E, after the insulating interlayer is deposited in the gap between the stepped structures, a photoresist pattern may be formed that exposes an area at which a contact hole is to be formed in a subsequent process. In embodiments of the present invention, the insulating interlayer comprises the aluminum oxide layer and the silicon oxide layer. Then, the insulating interlayer may be partially etched away using the photoresist pattern as an etching mask so that the substrate between the gate structures 130 is exposed. After the etching process is completed, a cleaning process may be performed on the substrate to remove various polymers that may be generated during the etching process. After this cleaning process is completed, a self-aligned contact hole 154 is provided on the substrate, and a top surface of the source/drain region disposed between the gate structures 130 is exposed.

The etching solutions that are used to perform the cleaning process may contain etching components that are provided for etching away the polymer therein. A silicon oxide layer will typically have a higher resistance to this etching process than will an SOG layer. As a result, when these etching solutions are applied to a stepped structure formed in the above-described conventional manner (i.e., a structure in which part of the bottom portion of the insulating interlayer is SOG that has not been converted into the silicon oxide layer) the bottom portion of the insulating interlayer may be rapidly etched away during the cleaning process as compared with the upper portion of the stepped structure. In contrast, with embodiments of the present invention, at the bottom portion of stepped structure most or all of the SOG layer may be transformed into a silicon oxide layer. This silicon oxide layer has increased resistance to etching during the cleaning process as the molecules of the silicon oxide layer may be strongly bonded to each other and the bonding structure of the silicon oxide layer may be much denser. As a result, unwanted etching of the insulating interlayer may be reduced or minimized during the cleaning process, decreasing the probability that one or more voids may be formed due to a partial etching of the insulating interlayer at the bottom portion thereof.

Hereinafter, reduction of the void in the insulating interlayer is described in detail with respect to certain embodiments of the present invention.

Figure 4A:
FIGS. 4A and 4B are scanning electron microscope (SEM) photographs of insulating interlayers made according to certain embodiments of the present invention.
Figure 4B:

FIGS. 4A and 4B are scanning electron microscope (SEM) photographs of devices with an insulating interlayer constructed according to embodiments of the present invention. In the embodiment of FIGS. 4A and 4B, the insulating interlayer is formed using a metal oxide layer and an SOG layer that includes a siloxane-based material.

The insulating interlayer in FIG. 4A was formed using an aluminum oxide layer as the catalytic layer, and the insulating interlayer in FIG. 4B was formed using a titanium oxide layer as the catalytic layer.

In the device depicted in FIG. 4A, the aluminum oxide layer was coated on a surface of the stepped structure to a thickness of about 10 Å as the catalytic layer, and the SOG layer including the siloxane-based material was coated on the aluminum oxide layer. The device was heated after deposition of the SOG layer at a temperature of about 700° C. for 30 minutes under a condition of steam oxidation, thereby forming the insulating interlayer shown in FIG. 4A. The substrate was then cut to expose a cross-sectional surface of the gate structure, and a wet etching process was performed on the cross-sectional surface for 10-20 seconds using an etching solution of limulus amebocyte lysate (LAL). LAL is a mixture of hydro-fluoride (HF), ammonium fluoride (NH4F) and de-ionized wafer, and is proper for wet-etching the silicon oxide layer. FIG. 4A is a picture of the cross-sectional surface of the gate structure photographed by the SEM after the wet etching process. In general, when a portion of the insulating interlayer is etched away and nothing remains thereon, that portion of the structure will appear as a black area in a SEM photograph, whereas when the insulating interlayer is not etched away and the insulating interlayer still remains, that portion of the structure will appear as a white area in the SEM photograph.

As can be seen in FIG. 4A, a white line is shown along a profile of the gate structure. As noted above, this indicates that the insulating interlayer between the gate structures is not etched away, and the etching rate of the upper and bottom portions of the insulating interlayer may be almost the same even though the above-described wet etching process was performed. Thus, FIG. 4A confirms that the etching resistance of the insulating interlayer may be improved through use of the aluminum oxide layer according to an exemplary embodiment of the present invention.

In the device depicted in FIG. 4B, the titanium oxide layer was coated on the surface of the stepped structure to a thickness of about 10 Å as the catalytic layer, and an SOG layer that includes a siloxane-based material was coated on the titanium oxide layer. The device was heat treated after deposition of the SOG layer at a temperature of about 700° C. for 30 minutes under a condition of steam oxidation to form the insulating interlayer shown in FIG. 4B. The substrate was then cut to expose a cross-sectional surface of the gate structure, and a wet etching process was performed on the cross-sectional surface for 10-20 seconds using a LAL etching solution. FIG. 4B is a SEM photograph of the cross-sectional surface of the gate structure after the wet etching process.

As seen in FIG. 4B, a white line is shown along a profile of the gate structure. Moreover, the white line in FIG. 4B is brighter (i.e., whiter) than the corresponding white line in FIG. 4A, which indicates that the insulating interlayer between the gate structures is etched even less in the device of FIG. 4B.

Figure 5A:
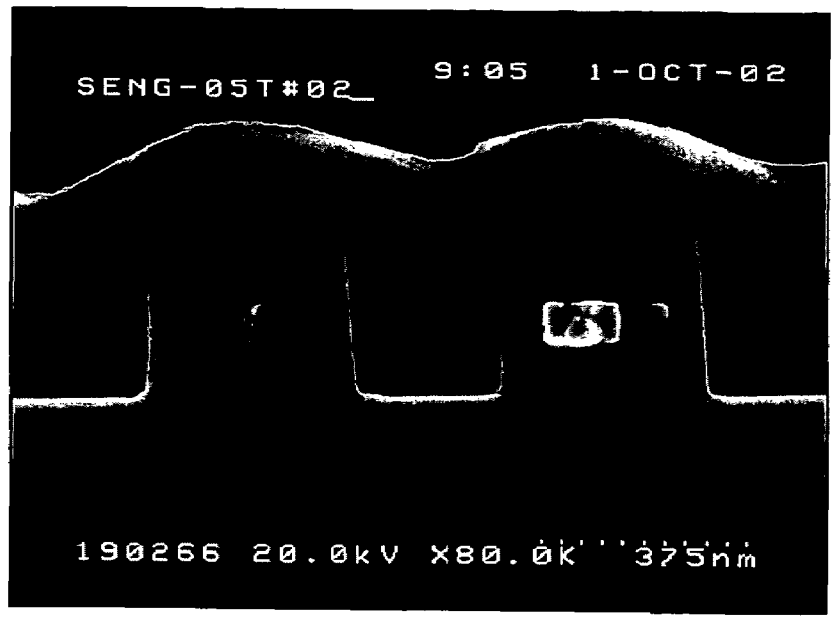
Figure 5B:
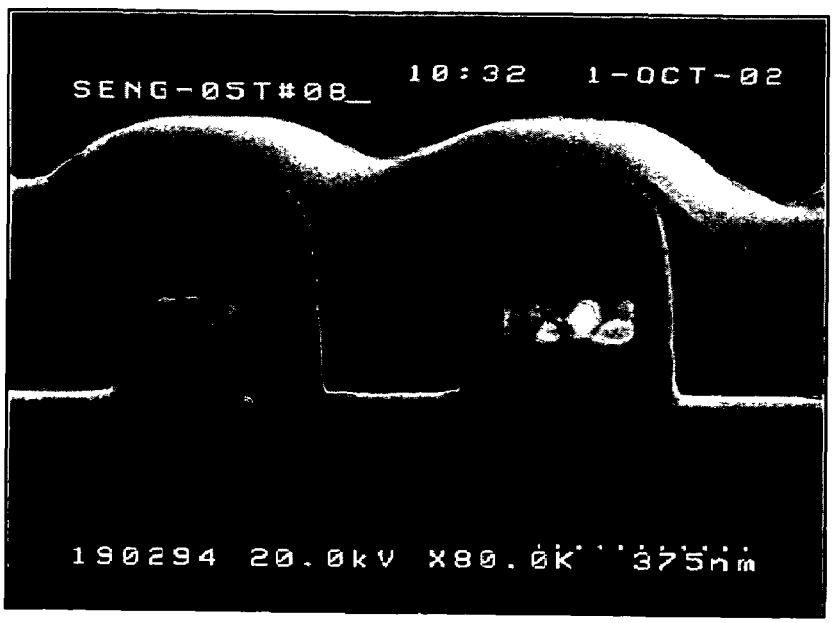

FIGS. 5A and 5B are additional SEM photographs of devices with insulating interlayers fabricated according to certain embodiments of the present invention. In the embodiments of FIGS. 5A and 5B, the insulating interlayer is formed using a metal oxide layer and an SOG layer that includes a silanol-based material.

The insulating interlayer in FIG. 5A was formed using the same process described above with respect to the device of FIG. 4A, except that the SOG layer in the device of FIG. 5*a* includes a silanol-based material. Similarly, the insulating interlayer in FIG. 5B was formed using the same process described above with respect to the device of FIG. 4B, except that the SOG layer in the device of FIG. 5B includes a silanol-based material. The SEM photographs of FIGS. 5A and 5B were obtained under the same conditions as the SEM photographs of FIGS. 4A and 4B.

As can be seen in FIGS. 5A and 5B, a portion of the insulating interlayer is etched away at a bottom portion of the gap between the gate structures. However, the area of the insulating interlayer which is etched away is reduced as compared with a conventional insulating interlayer. The reduction of the area that is etched away indicates that the etching resistance of the insulating interlayer is improved when the silanol-based material is used as compared to conventional insulating interlayers.

Figure 6A:
FIGS. 6A and 6B are SEM photographs of insulating interlayers made according to still further embodiments of the present invention.
Figure 6B:
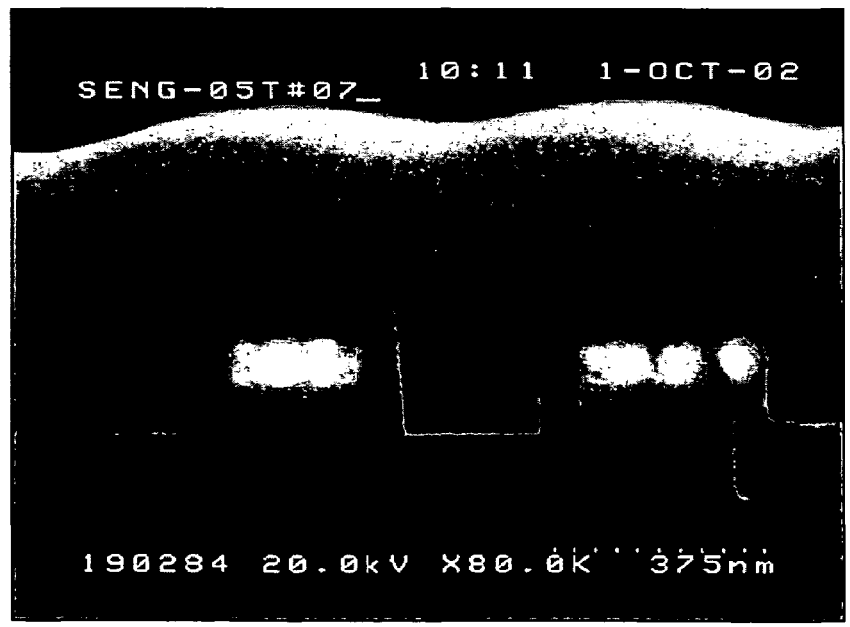

FIGS. 6A and 6B are SEM photographs of devices with insulating interlayers fabricated according to further embodiments of the present invention. In the embodiments of FIGS.

6A and 6B, the insulating interlayer is formed using a metal oxide layer and an SOG layer that includes a polysilazane-based material.

The insulating interlayer in FIG. 6A was formed using the same process as was used to form the insulating interlayer of FIG. 4A, except that the SOG layer in the device of FIG. 6A includes a polysilazane-based material. Likewise the insulating interlayer in FIG. 6B was formed using the same process as was used to form the insulating interlayer of FIG. 4B except that the SOG layer in the device of FIG. 6B includes the polysilazane-based material. The SEM photographs in FIGS. 6A and 6B were also obtained under the same conditions as the SEM photographs of FIGS. 4A and 4B.

As can be seen in FIGS. 6A and 6B, a portion of the insulating interlayer is etched away adjacent the bottom portion of the gap between the gate structures. However, the portion of the insulating interlayer that is etched away is significantly reduced as compared with a device that includes a conventional insulating interlayer. This reduction in the amount of etching indicates that the etching resistance of the insulating interlayer may be improved as compared to the conventional insulating interlayer when the polysilazane-based material is used. FIG. 6B shows that the etching resistance of the insulating interlayer may be more improved when the titanium layer is used as the catalytic layer.

FIGS. 4A-6B suggest that the etching resistance of the insulating interlayer may be most improved when the SOG layer is formed using a siloxane-based material. This increased level of improvement may occur because the hydrogen in the siloxane-based material is easily removed by chemical reaction with the oxygen in the catalytic layer, and the silicon in the siloxane-based material is easily reacted with the oxygen in the catalytic layer. Both reactions may facilitate increasing the density of the insulating interlayer.

Thus, according to embodiments of the present invention, insulating interlayers that are strongly combined to an underlying layer or a substrate even at a bottom portion of the gap between the stepped structures having a high aspect ratio may be provided. These insulating interlayers may have a dense structure, good step coverage and/or an improved etching resistance. In addition, the above-described insulating interlayers may be relatively resistant to etching during subsequent cleaning processes, so that process failures due to the etching of the insulating interlayer during the cleaning process may be reduced or prevented.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming an insulating layer in a semiconductor device, the method comprising:
   forming a metal layer on a semiconductor structure that includes a plurality of gap regions thereon using an atomic layer deposition process and thereafter oxidizing the metal layer to form a metal oxide layer;
   forming a spin-on-glass layer on the metal oxide layer; and then
   heating the semiconductor structure to a temperature of at least about 400° C.,
   wherein the metal oxide layer has a thickness of less than about 15 Å.

2. The method of claim 1, wherein heating the semiconductor structure to the temperature of at least about 400° C. further comprises providing sufficient heat treatment to convert the spin-on-glass layer into a silicon oxide layer.

3. The method of claim 2, wherein the metal oxide layer acts as a catalyst to increase the density of silicon-oxide bonds in at least portions of the spin-on-glass layer.

4. The method of claim 2, wherein at least some of the plurality of gaps are between adjacent conductive structures, wherein the metal oxide layer has a higher dielectric constant than does the silicon oxide layer, and wherein parasitic capacitance between the adjacent conductive structures is substantially unaffected by the inclusion of the metal oxide layer.

5. The method of claim 1, wherein the spin-on-glass layer is formed directly on the metal oxide layer.

6. The method of claim 1, wherein the semiconductor structure is heated at a temperature between about 600 to 900° C.

7. A method of forming an insulating layer of a semiconductor device, comprising:
   forming one or more layers on a substrate to provide a semiconductor structure that includes a plurality of gap regions on the substrate;
   forming a catalytic layer for catalyzing a combination of silicon and oxygen in at least some of the plurality of gap regions;
   forming a spin-on-glass (SOG) layer directly on the catalytic layer and in at least some of the plurality of gap regions; and
   forming a silicon oxide layer by heating the SOG layer;
   wherein the catalytic layer is formed to a thickness of no more than about 10 Å.

8. The method of claim 7, wherein the catalytic layer comprises a metal layer or a metal oxide layer.

9. The method of claim 8, wherein the metal layer comprises at least one of aluminum (Al), barium (Ba), strontium (Sr), titanium (Ti), bismuth (Bi), niobium (Nb), tantalum (Ta), gallium (Ga), indium (In), scandium (Sc), vanadium (V), chromium (Cr), manganese (Mn), cobalt (Co), iron (Fe), nickel (Ni), copper (Cu), zinc (Zn) and/or lanthanum (La).

10. The method of claim 8, wherein the metal oxide layer comprises at least one of aluminum oxide, barium oxide, strontium oxide, titanium oxide, bismuth oxide, niobium oxide, tantalum oxide, gallium oxide, indium oxide, scandium oxide, vanadium oxide, chromium oxide, manganese oxide, cobalt oxide, iron oxide, nickel oxide, copper oxide, zinc oxide and/or lanthanum oxide.

11. The method of claim 7, wherein the plurality of gap regions comprise trench isolation structures and/or contact holes.

12. A method of forming an insulating layer of a semiconductor device, comprising:
   forming one or more layers on a substrate to provide a semiconductor structure that includes a plurality of gap regions on the substrate;
   forming a catalytic layer for catalyzing a combination of silicon and oxygen on the semiconductor structure;
   forming a spin-on-glass (SOG) layer on the catalytic layer; and
   forming a silicon oxide layer by heating the SOG layer,
   wherein the catalytic layer is formed by an atomic layer deposition (ALD) process;
   wherein the catalytic layer includes a first atomic layer through a fifth atomic layer.

13. A method of forming an insulating layer of a semiconductor device, comprising:
   forming one or more layers on a substrate to provide a semiconductor structure that includes a plurality of gap regions on the substrate;

forming a catalytic layer for catalyzing a combination of silicon and oxygen in at least some of the plurality of gap regions;

forming a spin-on-glass (SOG) layer directly on the catalytic layer and in at least some of the plurality of gap regions; and forming a silicon oxide layer by heating the SOG layer;

wherein the SOG layer comprises at least one of a siloxane-based material, a silanol-based material and/or a silazane-based material.

14. A method of forming an insulating layer of a semiconductor device, comprising:

forming one or more layers on a substrate to provide a semiconductor structure that includes a plurality of gap regions on the substrate;

forming a catalytic layer for catalyzing a combination of silicon and oxygen in at least some of the plurality of gap regions;

forming a spin-on-glass (SOG) layer directly on the catalytic layer and in at least some of the plurality of gap regions; and forming a silicon oxide layer by heating the SOG layer;

wherein heating the SOG layer comprises heating the SOG layer for at least about 10 minutes at a temperature of about 400° C. or more in an oxidizing atmosphere;

wherein the catalytic layer has a thickness of less than about 10 Å.

15. The method of claim 14, wherein the oxidizing atmosphere includes oxygen and/or water.

16. A method of forming an insulating layer of a semiconductor device, comprising:

forming one or more layers on a substrate to provide a semiconductor structure that includes a plurality of gap regions on the substrate;

forming a catalytic layer for catalyzing a combination of silicon and oxygen in at least some of the plurality of gap regions;

forming a spin-on-glass (SOG) layer directly on the catalytic layer and in at least some of the plurality of gap regions; and forming a silicon oxide layer by heating the SOG layer;

wherein heating the SOG layer comprises heating the SOG layer for at least about 10 minutes at a temperature of at least about 400° C. in an inert gas atmosphere or in a vacuum atmosphere;

wherein the catalytic layer has a thickness of less than about 10 Å.

17. A semiconductor device, comprising:

a structure including at least one semiconductor layer on a substrate, the structure including a top surface having a plurality of openings therein;

a catalytic layer on the top surface of the structure and directly on side and bottom surfaces of each of the plurality of openings; and a silicon oxide layer directly on the catalytic layer, the silicon oxide layer filling each of the plurality of openings, wherein the catalytic layer is formed to a thickness of no more than about 10 Å, wherein the catalytic layer comprises a metal layer or a metal oxide layer.

18. A method of forming an insulating layer in a semiconductor device, the method comprising:

forming a metal oxide layer on a semiconductor structure that includes a plurality of gap regions thereon;

forming a spin-on-glass layer on the metal oxide layer; and then heating the semiconductor structure to a temperature of at least about 400° C., wherein the metal oxide layer has a thickness of less than about 15 Å, and wherein the metal oxide layer comprises a titanium oxide layer.

* * * * *